(12) United States Patent
Sevenhans et al.

(10) Patent No.: US 7,279,973 B1
(45) Date of Patent: Oct. 9, 2007

(54) H-BRIDGE UTILIZING INTERMEDIATE SWITCHING PHASE(S)

(75) Inventors: Joannes Mathilde Josephus Sevenhans, Brasschaat (BE); Damien Luc Francois Macq, Louvain-La-Neuve (BE); Herman Joris Casier, Kuurne (BE); Johan Camiel Julia Janssens, Asse (BE)

(73) Assignee: AMI Semiconductor Belgium BVBA, Oudenaarde (BE)

( * ) Notice: Subject to any disclaimer, the term of this patent is extended or adjusted under 35 U.S.C. 154(b) by 160 days.

(21) Appl. No.: 11/261,013

(22) Filed: Oct. 28, 2005

Related U.S. Application Data (60) Provisional application No. 60/719,768, filed on Sep. 23, 2005.

(51) Int. Cl.
*H03F 3/217* (2006.01)
(52) U.S. Cl. .................................. 330/251; 330/207 A
(58) Field of Classification Search ................ 330/251, 330/121
See application file for complete search history.

(56) References Cited

U.S. PATENT DOCUMENTS

| | | | |
|---|---|---|---|
| 5,479,134 A * | 12/1995 | Nishioka et al. ............ 330/273 |
| 6,097,245 A | 8/2000 | Dobbelaere et al. ........ 327/560 |
| 6,396,933 B1 | 5/2002 | Jung et al. .................... 381/96 |
| 7,190,224 B2 * | 3/2007 | Sutardja ................. 330/207 A |

OTHER PUBLICATIONS

Class AB-D-G Line Driver for Central Office Asymmetric Digital Subscriber Line Systems Jaynie Shorb and David J. Allstot and Robert Roze 2002 IEEE V-405.
A Power-Efficient Audio Amplifier Combining Switching and Linear Techniques Ronan A. R. van der Zee and Ed (A.J.M. can Tuijl 1999 IEEE IEEE Journal of Solid State Circuits, vol. 34, No. 7, Jul. 1999.

\* cited by examiner

*Primary Examiner*—Robert Pascal
*Assistant Examiner*—Alan Wong
(74) *Attorney, Agent, or Firm*—Workman Nydegger (57) ABSTRACT

An H-bridge circuit capable of performing switching using one or more intermediate voltage phases each held for a period of time in the midst of the switching operation. This reduces power dissipation associated with the switching operation, while only using one set of high/low voltage supplies. The H-bridge may be used to provide current via an inductor to a load. A class AB amplifier may be placed in parallel with the H-bridge to provide supplemental correcting current to the load to allow the combination to act as an efficient and accurate signal driver. Furthermore, the use of intermediate voltages in the H bridge allows for increased slew rates for any given operation frequency, and allows for the driving of a given signal on the load using a lower operational frequency.

20 Claims, 8 Drawing Sheets

H-BRIDGE UTILIZING INTERMEDIATE SWITCHING PHASE(S)

CROSS-REFERENCE TO RELATED APPLICATIONS

This patent application claims the benefit of U.S. provisional patent application Ser. No. 60/719,768, filed Sep. 23, 2005, which provisional patent application is incorporated herein by reference in its entirety.

BACKGROUND OF THE INVENTION

1. The Field of the Invention

The principles of the present invention relate to a class D amplifier implemented as an H-bridge that implements switching using one or more intermediate switching phases.

2. The Relevant Technology

Electronic circuitry provides complex functionality that is proving ever more, useful. Electronic circuitry pervades our modern lives in areas such as communication, entertainment, travel, productivity, and the like. One common type of circuit is the class D amplifier, which performs switching operations to generate a pulse signal. If an input signal increases to have a higher voltage than a reference voltage, the output pulse signal transitions from one binary state to another binary state. If the input signal decreases to have a lower voltage than a reference voltage, the output pulse signal transitions back from the other binary state to the original binary state.

Figure 10:
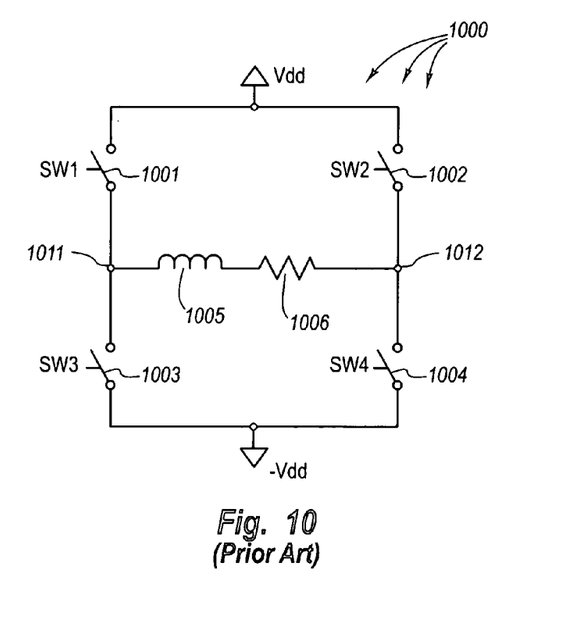
FIG. 10 illustrates an H-bridge in accordance with the prior art.

Class D amplifiers are known to be highly efficient, and can have the form of an H-bridge. FIG. 10 illustrates a conventional H-bridge 1000. The conventional H-bridge includes four switches 1001 through 1004, an inductor 1005 and a resistor 1006. Switches 1001 and 1002 may be, for example, p-type Field Effect Transistors (FETs). Switches 1003 and 1004 may be, for example, n-type FETs.

In order to invoke one binary output state, switches 1001 and 1004 are closed, and switches 1002 and 1003 are open, allowing current to flow from high voltage supply Vdd through switch 1001, inductor 1005, resistor 1006 and switch 1004, into the low voltage supply −Vdd (i.e., minus Vdd). Thus, a high voltage is generated on node 1011 which is at or close to Vdd, whereas a low voltage is generated on node 1012 which is at or close to −Vdd (minus Vdd). This relies on the impedance of the series combination of the inductor 1005 and the resistor 1006 being sufficient such that it dominates over the impedance through the switches. In order to invoke the opposite binary state, switches 1001 and 1004 are open, and switches 1002 and 1003 are closed, allowing current to flow from high voltage supply Vdd through switch 1002, resistor 1006, inductor 1005, and switch 1003 into low voltage supply −Vdd (i.e., minus Vdd). Accordingly a high voltage is generated on node 1012 which is at or close to Vdd, whereas a low voltage is generated on node 1011 which is at or close to −Vdd (minus Vdd).

Figure 11A:
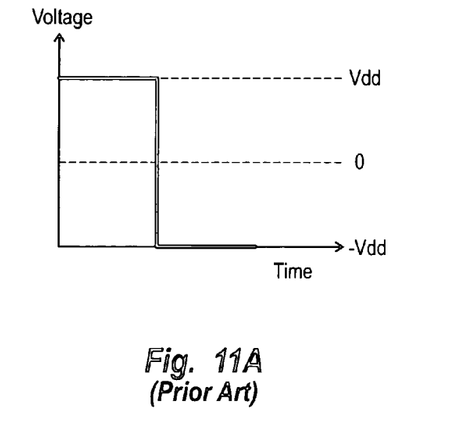
FIG. 11A illustrates a signal timing diagram showing a transition from high to low of the voltage at an output terminal of the H-bridge of FIG. 10.
Figure 11B:
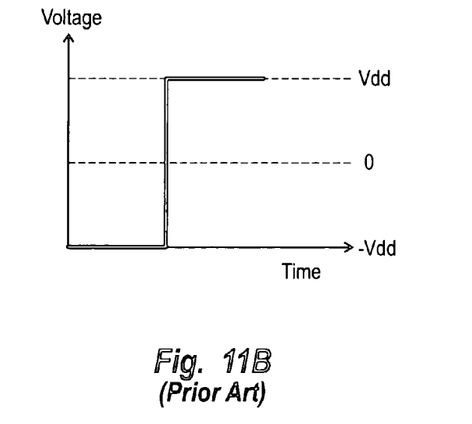
FIG. 11B illustrates a signal timing diagram showing a transition from low to high of the voltage at an output terminal of the H-bridge of FIG. 10.

Thus, the voltage at the output nodes 1011 and 1012 swings rapidly between Vdd and −Vdd (minus Vdd) relatively quickly during a switching operation for a total voltage change of nearly twice Vdd. FIG. 11A shows the transition of the voltage at intermediate node 1011 during a high-to-low switch operation, whereas FIG. 11B shows the transition of the voltage at intermediate node 1011 during a low-to-high switch operation. Note the rapid change of voltage between Vdd and −Vdd (minus Vdd)

There are often power losses during a switching operation (often referred to as "switching losses" or "fCV$^2$" losses). As implied by the term "fCV$^2$" losses, the power loss is proportional to the operational frequency of the H-bridge (f), the drain parasitic capacitances on the output nodes 1011 and 1012 (C), and the square of the voltage change (V$^2$).

Thus, even though class D amplifiers such as the H-bridge are highly efficient, it would be advantageous to improve power efficiency even further to thereby reduce heat generation and operational costs.

BRIEF SUMMARY OF THE INVENTION

The principles of the present invention relate to an H-bridge circuit that may serve as a Class D amplifier, and is capable of performing switching between a high voltage and a low voltage using one or more intermediate voltage phases each held for a period of time in the midst of the switching operation. This reduces power dissipation associated with the switching operation, while only using one set of high/low voltage supplies. Furthermore, the use of intermediate voltages in the switching operation mitigates the often undesirable impact of harmonics typically generated by a sudden switching operation.

In an alternative embodiment, the H-bridge may be used to provide current via an inductor to a load. A class AB amplifier may be placed in parallel with the H-bridge to provide supplemental correcting current to the load. The H-bridge (acting as a class D amplifier) provides the majority of the power and is highly efficient. The class AB amplifier is less power efficient, but is highly effective at providing controlled correcting current sufficient to drive an accurate signal on the load.

Although the class AB amplifier is not highly efficient, its power requirements are kept low by triggering the H-bridge to change states and provide more current when the class AB amplifier current reaches a reference value. Thus, the class AB amplifier delivers little current, and thus the low efficiency of the class AB amplifier has less negative impact on the overall high efficiency of the combination class D and class AB amplifiers. Therefore, the combination of the H-bridge and class AB amplifier allows for a highly efficient and controlled mechanism for driving a load. Furthermore, the use of intermediate voltages in the H bridge allows for increased slew rates for any given operation frequency, and allows for the driving of a given signal on the load using a lower operational frequency.

These and other features and advantages of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The principles of the present invention relate to an H-bridge circuit that may serve as a Class D amplifier, and that is capable of performing switching using one or more intermediate voltage phases or states, each intermediate voltage phase being held for a period of time in the midst of the switching operation. This reduces power dissipation associated with the switching operation, while only using one set of high/low voltage supplies. In an alternative embodiment, the H-bridge may be used to provide current via an inductor to a load. A class AB amplifier may be placed in parallel with the H-bridge to provide supplemental correcting current to the load to allow the combination to act as an efficient and accurate signal driver. Furthermore, the use of intermediate voltages in the H-bridge allows for increased slew rates for any given operation frequency, and allows for the driving of a given signal on the load using a lower operational frequency.

Figure 1:
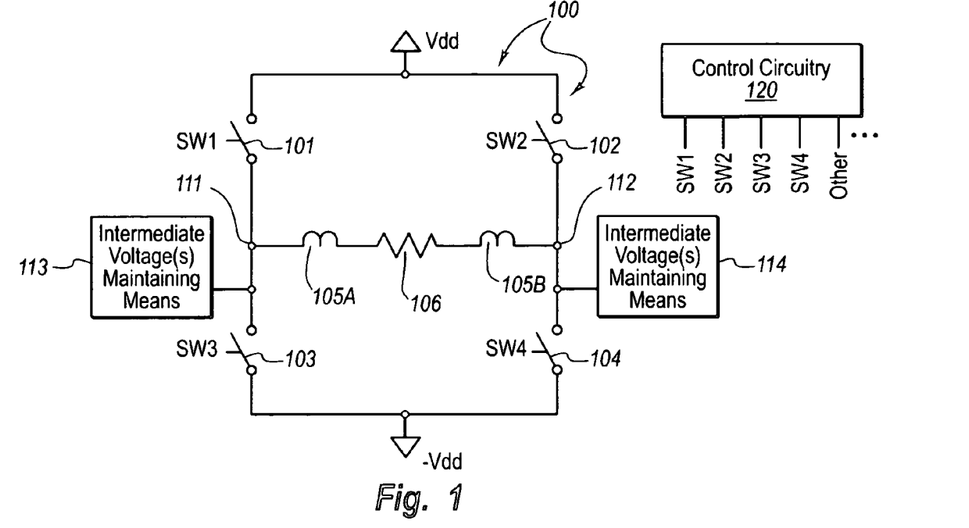
FIG. 1 illustrates an H-bridge circuit in accordance with the principles of the present invention including a means for maintaining the output nodes of the H-bridge at a temporally stable intermediate voltage while performing a switching operation, and including control circuitry for controlling switching of the H-bridge.

FIG. 1 illustrates an H-bridge circuit 100 in accordance with the principles of the present invention. FIG. 1 also shows control circuitry 120 for controlling the H-bridge circuit 100. The H-bridge circuit 100 includes four switches 101 through 104, inductors 105A and 105B, a resistor 106, means for maintaining 113 the first output terminal 111 at one or more temporally stable intermediate voltages, and means for maintaining 114 the second output terminal at one or more temporally stable intermediate voltages. In this description and in the claims, "temporally stable" means that either 1) the voltage is relatively constant as when tied to an approximately fixed voltage source, 2) the voltage is permitted to move without the node drawing significant current from a high voltage supply (e.g., Vdd) and without the node sinking significant current to a low voltage supply (e.g., minus Vdd), 3) the voltage is permitted to decline at a slower averaged rate (e.g., less than half) than the average decline rate during a switch high-to-low, or 4) the voltage is permitted to increase at a slower averaged rate (e.g., less than half) than the average increase rate during a switch low-to-high.

Pull up switches 101 and 102 are configured to selectively couple the first and second output terminals 111 and 112, respectively, to a high voltage supply (in the illustrated case, "Vdd"). The pull up switches 101 and 102 may be, for example, p-type Field Effect Transistors (FETs), pnp bipolar transistors, or any other component or combination of components that may act as a switch to a high voltage supply (such as Vdd).

Pull down switches 103 and 104 are configured to selectively couple the first and second output terminals 111 and 112, respectively, to a low voltage supply (in the illustrated case, "–Vdd" or "minus Vdd). Switches 103 and 104 may be, for example, n-type FETs, npn bipolar transistors, or any other component or combination of components that may act as a switch to a low voltage supply (such as minus Vdd).

The inductors 105A and 105B, and the resistor 106 are coupled in series between the output terminals 111 and 112. The means for maintaining 113 and 114 are any circuitry or mechanism that are capable of maintaining the corresponding output node 111 and 112, respectively, at a temporally stable intermediate voltage corresponding to each of one or more intermediate phases while in the process of switching from one binary state to the opposite binary state.

As previously mentioned, the control circuitry 120 controls the H-bridge circuit 100 to switch between two binary states, and to transition to and from one or more intermediate states in the switch from one binary state to the other.

To enforce one binary state in which the output node 111 is high, and the output node 112 is low, the control circuitry 120 asserts signals SW1 and SW4 high, deasserts signals SW2 and SW3 low, and asserts or deasserts other signals OTHER as needed to deactivate the means for maintaining 113 and 114. In this state, current flows from high voltage supply Vdd through pull up switch 101, inductor 105A, resistor 106, inductor 105B and pull down switch 104 to the low voltage supply −Vdd (minus Vdd). Accordingly, the dominating impedance across the series combination of inductor 105A, resistor 106, and inductor 105B causes the output node 111 to be high and the output node 112 to be low.

To enforce the opposite binary state in which the output node 111 is low, and the output node 112 is high, the control circuitry 120 asserts signals SW2 and SW3 high, deasserts signals SW1 and SW4 low, and asserts other signals OTHER as needed to deactivate the means for maintaining 113 and 114. In this state, current flows from high voltage supply Vdd through pull up switch 102, inductor 105B, resistor 106, inductor 105A and pull down switch 103 to the low voltage supply −Vdd (minus Vdd). Accordingly, the dominating impedance across the series combination of inductor 105A, resistor 106, and inductor 105B causes the output node 111 to be low and the output node 112 to be high.

In order to enforce any one of potentially multiple intermediate phases that occur during the switching phase, the control circuitry 120 controls (e.g., via any of signals SW1, SW2, SW3, SW4, OTHER, or the like) the means for maintaining 113 and 114 to maintain the voltage at the corresponding output nodes 111 and 112 at a corresponding temporally stable intermediate voltage appropriate for that intermediate phase.

Instead of having the output terminals transition directly and immediately between one binary state and the other, the control circuitry 120 causes the H-bridge to transition through one or more intermediate states. Thus, instead of output node 111 transitioning from +Vdd to −Vdd for a total voltage change of 2×Vdd, the voltage at the output node may transition from +Vdd to some intermediate voltage (e.g., 0 V) in one transition, maintain at or close to the intermediate voltage for some time, and then transition from the intermediate voltage to −Vdd.

Figure 2A:
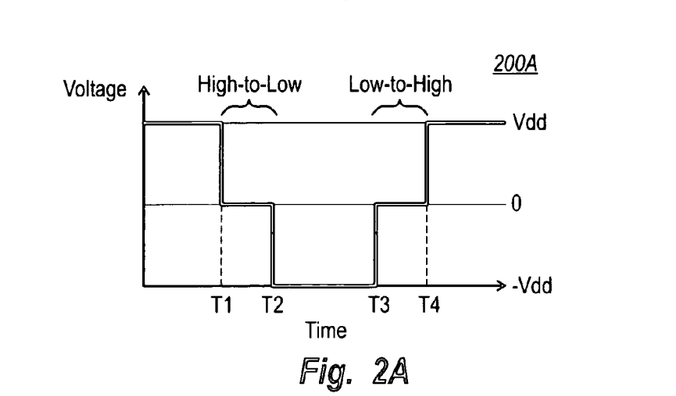
FIG. 2A show an output signal timing diagram showing switching of the H-bridge in both directions in the case where the H-bridge has one intermediate state.

FIG. 2A illustrates a signal timing diagram showing a possible transition of output node 111 from high-to-low and then from low-to-high. At time T1, the control circuitry 120 causes the H-bridge 100 to initiate the transition high-to-low by first transitioning from the high voltage state (as viewed from the perspective of output node 111) to an intermediate voltage state (in this case, 0 volts). At time T2, the control circuitry 120 causes the H-bridge 100 to complete the transition high-to-low by transitioning from the intermediate voltage to the low voltage state.

This control circuitry 120 may also perform staged switching in the opposite direction as well. In order to transition from low-to-high, at time T3, the control circuitry 120 causes the H-bridge to initiate the transition low-to-high by first transitioning from the low voltage state (once again, as viewed from the perspective of the output node 111) to an intermediate voltage state (also in this case, 0 volts). At time T4, the control circuitry 120 causes the H-bridge 100 to complete the transition low-to-high by transitioning from the intermediate voltage to the high voltage state.

Accordingly, the total change in voltage at any given state transition is cut in half from 2×Vdd to simply Vdd. This reduces the switching (or "fCV²") losses by 75%. The reduction in switching losses in a one intermediate state case is maximized when the intermediate voltage is halfway between the high and low voltage supplies. However, some reduction of switching losses may be encountered for any choice of an intermediate switching voltage, so long as that intermediate voltage lies somewhere between the high voltage supply and the low voltage supply.

Figure 2B:
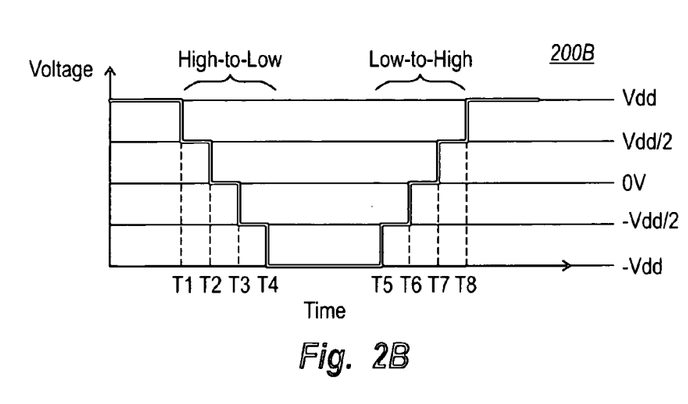
FIG. 2B shows an output signal timing diagram showing switching of the H-bridge in both directions in the case where the H-bridge has three equally distributed intermediate states.

FIG. 2B illustrates a signal timing diagram showing a possible transition of output node 111 from high-to-low and then from low-to-high. In this case, however, the transition occurs via three intermediate states. At time T1, the control circuitry 120 causes the H-bridge 100 to initiate the transition high-to-low by first transitioning from the high voltage state (as viewed from the perspective of output node 111) to a first intermediate voltage state (in this case, Vdd/2). At time T2, the control circuitry 120 causes the H-bridge 100 to continue the transition high-to-low by next transitioning from the first intermediate voltage to a second intermediate voltage state (in this case, 0 volts). At time T3, the control circuitry 120 causes the H-bridge 100 to continue the transition high-to-low by next transitioning from the second intermediate voltage to a third intermediate voltage state (in this case, −Vdd/2). At time T4, the control circuitry 120 causes the H-bridge 100 to complete the transition high-to-low by transitioning from the third intermediate voltage to the low voltage state.

Similarly, in order to transition low-to-high using three intermediate states, at time T5, the control circuitry 120 causes the H-bridge 100 to initiate the transition low-to-high by first transitioning from the low voltage state (as viewed from the perspective of output node 111) to a first intermediate voltage state (in this case, minus Vdd/2). At time T6, the control circuitry 120 causes the H-bridge 100 to continue the transition low-to-high by next transitioning from the first intermediate voltage to a second intermediate voltage state (in this case, 0 volts). At time T7, the control circuitry 120 causes the H-bridge 100 to continue the transition low-to-high by next transitioning from the second intermediate voltage to a third intermediate voltage state (in this case, plus Vdd/2). At time T8, the control circuitry 120 causes the H-bridge 100 to complete the transition low-to-high by transitioning from the third intermediate voltage to the high voltage state.

Accordingly, the total change in voltage at any given state transition is cut by 75% from 2×Vdd to Vdd/2. This reduces the switching (or "fCV²") losses by approximately 94% assuming a relatively even distribution between intermediate voltages. However, some reduction of switching losses may be encountered for any choice of an intermediate switching voltages, so long as that intermediate voltages are somewhere between the high voltage supply and the low voltage supply, even if the intermediate voltages are not evenly distributed between the high and low voltage supplies. Thus, the use of three intermediate voltage states could further reduce switching losses.

In addition to reduced switching losses, the use of intermediate voltage states in the midst of a larger transition reduces the magnitude of harmonics, which are often undesirable and are typically filtered out. Furthermore, harmonics can even interfere with the signal being driven on the load thereby introducing signal distortion. Thus, the reduced harmonics can improve performance.

As previously mentioned, the control circuitry 120 enforces the intermediate states by controlling the means for maintaining 113 and 114 so as to maintain the output nodes 111 and 112, respectively, at an appropriate temporally stable intermediate voltage. The manner in which the control circuitry 120 controls the means for maintaining 113 and 114 depends on the precise structure of the means for maintaining 113 and 114. The means for maintaining 120 may have any structure that is capable of maintaining the corresponding voltage at the appropriate intermediate voltage for a period of time. For illustrative purposes, FIGS. 3A through 3D show four different embodiments of the H-bridge, each of which employing a different structure for the means for maintaining. An example operation of the control circuitry 120 will be described with respect to each of these structures.

Figure 3A:
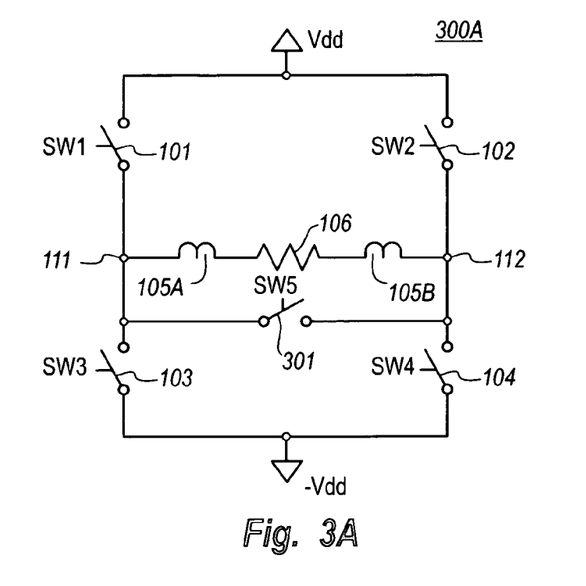
FIG. 3A illustrates the H-bridge circuit of FIG. 1 in which the means for maintaining includes an equalizing switch electrically connecting the two output nodes u of the H-bridge during an intermediate switching phase.

FIG. 3A illustrates one embodiment 300A of the H-bridge 100 of FIG. 1. Many of the components, including components 101, 102, 103, 104, 105A, 105B, 106, 111, 112, SW1, SW2, SW3 and SW4 may be similar to those described above with respect to FIG. 1. However, in FIG. 3A, the means for maintaining 113 and 114 takes the form of equalizing switch 301 controlled by signal SW5, which may also be provided by the control circuitry 120 illustrated in FIG. 1. The equalizing switch 301 is coupled in parallel with the series combination of the inductor 105A, the resistor 106, and the inductor 105B between the first output node 111 and the second output node 112.

The configuration of the H-bridge 300A of FIG. 3A may support one intermediate state in the switching operation. The control circuitry 120 may control the H-bridge to operate in the two binary states, and one intermediate state as follows.

In order to obtain a high binary state (e.g., a high voltage on first output node 111 and a low voltage on second output node 112), the control circuitry 120 closes switches 101 and 104, while keeping switches 102, 103 and 301 open. Accordingly, the control circuitry 120 causes current to flow from the high voltage supply (Vdd), through switch 101, through first output node 111, inductor 105A, resistor 106, inductor 105B, second output node 112, switch 104, and into the low voltage supply (minus Vdd). This causes the voltage at first output node 111 to pull high, whereas the voltage at second output node 112 draws low.

In order to transition to the low binary state, the control circuitry first causes the H-bridge to transition to an intermediate state. In the case of FIG. 3A, this is done by keeping switches 101, 102, 103 and 104 open, while closing switch 301 using signal SW5. In that case, the output nodes 111 and 112 are shorted together thereby equalizing at some intermediate voltage. In the specific embodiment shown in FIG. 3A, the level of the intermediate voltage will depend on the balance of parasitic capacitances in all of the switches, and will also depend on the ON resistance RON of the p-type and n-type switches in the H-bridge.

In order to complete the transition high-to-low, after keeping the H-bridge 300A in the intermediate state for some small period of time, the control circuitry 120 transitions to the low binary state (with output node 111 being at a low voltage) by opening switch 301, keeping switches 101 and 104 open, and closing switches 102 and 103. This causes current to flow from the high voltage supply (Vdd), through switch 102, through second output node 112, inductor 105B, resistor 106, inductor 105A, first output node 111, switch 103, and into the low voltage supply (minus Vdd). This causes the voltage at first output node 111 to draw low, whereas the voltage at second output node 112 pulls high.

In order to transition H-bridge 300A from low-to-high, the control circuitry once again opens switches 101, 102, 103 and 104, and closes switch 301, thereby causing the voltages at output nodes 111 and 112 to equalize at some intermediate voltage thereby placing the H-bridge 300A in the intermediate state. The high binary state is then achieved by closing switches 101 and 104, opening switch 301, and keeping switches 102 and 103 open.

Figure 3B:
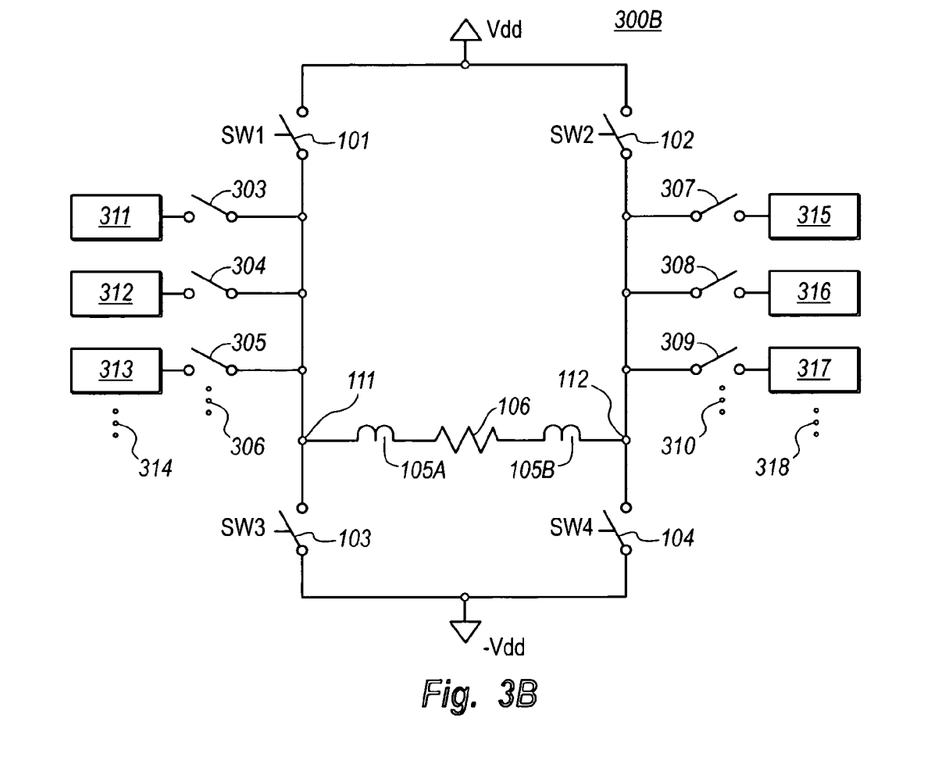
FIG. 3B illustrates the H-bridge circuit of FIG. 1 in which the means for maintaining includes a switching mechanism for forcing the output nodes of the H-bridge to three distinct intermediate voltages during each of three intermediate switching phases.

FIG. 3B illustrates another embodiment 300B of the H-bridge of FIG. 1. In this case, the means 113 takes the form of switches 303, 304, 305, amongst potentially others 306 coupling the first output node 111 to respective intermediate voltage supplies 311, 312, 313 amongst potentially others 314. Means 114 takes the form of switches 307, 308, 309, amongst potentially others 310 coupling the second output node 112 to respective intermediate voltage supplies 315, 316, 317, amongst potentially others 318. In one embodiment, the intermediate voltage supplies 311 through 313 may be the same as the intermediate voltage supplies 315 through 317, respectively. The voltage supplies 315 through 317 may be obtained by using a voltage divider with high resistances to thereby reduce circuit and power losses, without requiring a dedicated voltage supply be provided to the circuit.

The voltage supplies 311, 312 and 313 may take any intermediate voltage. However, to minimize power loss, the voltage supplies 311, 312, 313 may provide voltages Vdd/2, 0 volts, and minus Vdd/2, respectively. Similarly, the voltage supplies 315, 316 and 317 may provide voltages Vdd/2, 0 volts, and minus Vdd/2, respectively. In that configuration, the H-bridge 300B may perform switching through three evenly distributed intermediate states as illustrated in the signal timing diagram of FIG. 2B.

Specifically, the control circuitry 120 may control the H-bridge 300B as follows. To enforce the high binary state, switches 101 and 104 are closed, while switches 102 and 103 are open. The switches 303 through 305 and 307 through 309 are all open. This is represented by the period before T1 in FIG. 2B representing the voltage at the output node 111.

To transition to the first intermediate state (in which output node 111 has voltage Vdd/2, and output node 112 has voltage minus Vdd/2), the switches 101 and 104 are opened, switches 102 and 103 remain open, switches 304, 305, 307 and 308 remain open, and switches 303 and 309 are closed. Accordingly, output node 111 is forced to the voltage provided by voltage supply 311 (e.g., Vdd/2), whereas output node 112 is forced to the voltage provided by voltage supply 317 (e.g., minus Vdd/2). This is represented by the time period between T1 and T2 in FIG. 2B.

To transition to the second intermediate state (in which output node 111 has 0 volts, and output node 112 also has 0 volts), the switches 101 through 104 remain open, switches 304 and 308 are closed, switches 303 and 309 are opened, and switches 305 and 307 remain open. Alternatively, an equalization switch may be used to couple output node 111 to output node 112, with optionally the switch 304 coupling the output node 111 to 0 volts. This is represented by the time period between times T2 and T3 in FIG. 2B.

There may be just two intermediate states. However, if three were used, to transition to the third intermediate state (in which output node 111 has minus Vdd/2, and in which output node 112 has plus Vdd/2), switches 101 through 104 remain open, switches 305 and 307 are closed, switches 304 and 308 are opened, and switches 303 and 309 remain opened. This is represented by the time period between times T3 and T4 in FIG. 2B.

If there are further intermediate states, other switches may be used to connect to appropriate intermediate states in a similar manner. This is symbolically represented by the ellipses 306, 310, 314 and 318 in FIG. 3B. However, if just three intermediate states are used, the switch high-to-low may be completed by opening all of the switches 303, 304, 305, 307, 308, and 309, by keeping switches 101 and 104 open, and by closing switches 102 and 103. This is represented by the time period between times T4 and T5 in FIG. 2B. Switching low-to-high may be accomplished by reversing this process.

Figure 3C:
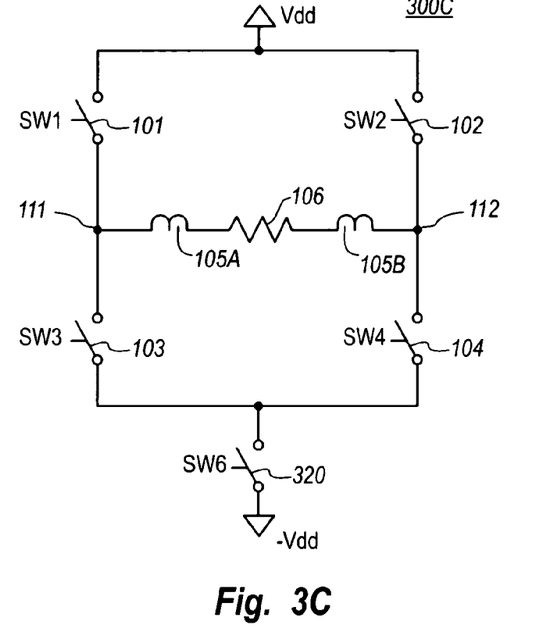
FIG. 3C illustrates the H-bridge circuit of FIG. 1 in which the means for maintaining is accomplished by using a switch that selectively isolates the pull down switches from the low voltage supply and closes the pull down switches to thereby electrically short circuit the output nodes of the H-bridge during intermediate switching phases.

FIG. 3C shows yet another embodiment 300C of the H-bridge 100 of FIG. 1. In this case, the means 113 and 114 includes a switch 320 configured to selectively connect and isolate the first and second pull down switches 103 and 104 from the low voltage supply (minus Vdd). Furthermore, the means includes the control circuitry 120, which generates control signal SW6 in a manner that will now be described.

To enforce the high binary state, the switches 101, 104 and 320 are closed (switch 320 being controlled by signal SW6), and the switches 102 and 103 are open, thereby causing current to flow from the output node 111 to the output node 112. In a transition high-to-low, the H-bridge 300C is caused to first transition to an intermediate state for a period of time. Specifically, the control circuitry 120 causes the switches 101, 102 and 320 to open, while closing switches 103 and 104. To enforce the low binary state, switches 102, 103 and 320 are closed, and the switches 101 and 104 are open.

In the intermediate state of this configuration, output nodes 111 and 112 are short circuited together through closed switches 103 and 104. This configuration is especially advantageous in cases in which the switches are n-type FETs, which contain an intrinsic diode that can, in some cases, degrade performance unless placed in series with another n-type FET. The switches 103 and 104 become two series connections of n-type FETs thereby reducing problems that may be caused by the parasitic diodes of each.

Figure 3D:
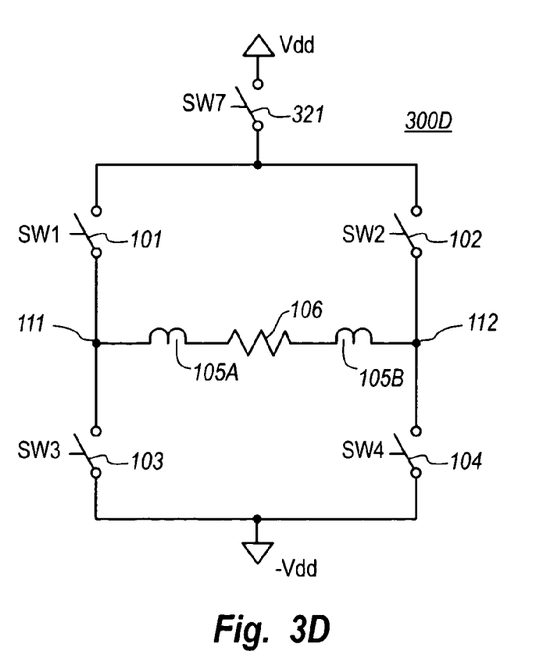
FIG. 3D illustrates the H-bridge circuit of FIG. 1 in which the means for maintaining is accomplished by using a switch that selectively isolates the pull up switches from the high voltage supply and closes the pull up switches to thereby electrically short circuit the output nodes of the H-bridge during intermediate switching phases.

FIG. 3D shows yet another embodiment 300D of the H-bridge 100 of FIG. 1. In this case, the means 113 and 114 includes a switch 321 configured to selectively connect and isolate the first and second pull up switches 101 and 102 from the high voltage supply (positive Vdd). Furthermore, the means includes the control circuitry 120, which operates to generate control signal SW7 in a manner that will now be described.

To enforce the high binary state, the switches 101, 104 and 321 are closed (switch 321 being controlled by signal SW7), and the switches 102 and 103 are open, thereby causing current to flow from the output node 111 to the output node 112. In a transition high-to-low, the H-bridge 300D is caused to first transition to an intermediate state for a period of time. Specifically, the control circuitry 120 causes the switches 103, 104 and 321 to open, while closing switches 101 and 102. To enforce the low binary state, switches 102, 103 and 321 are closed, and the switches 101 and 104 are open.

In this intermediate state of this configuration, output nodes 111 and 112 are short circuited together through closed switches 101 and 102. This configuration is especially advantageous in cases in which the switches are p-type FETs, which contain an intrinsic diode that can, in some cases degrade performance, unless placed in series with another p-type FET. The switches 101 and 102 become two series connections of p-type FETs thereby reducing problems that may be caused by the parasitic diodes of each.

Accordingly, FIGS. 1, 2A, 2B, and 3A through 3D, and their accompanying description, describe embodiments of an H-bridge circuit in which switching occurs by transitioning through one or more intermediate states. This results in reduced power losses during switching, and can operate to reduce undesirable harmonics.

Furthermore, the H-bridge circuit 100 of FIG. 1 may be used in combination with a class AB amplifier to drive a signal onto a load in a manner that improves efficiency, signal integrity, with increased slew rate, and at lower operating frequencies as will now be described with respect to FIG. 4 and the subsequent figures.

Figure 4:
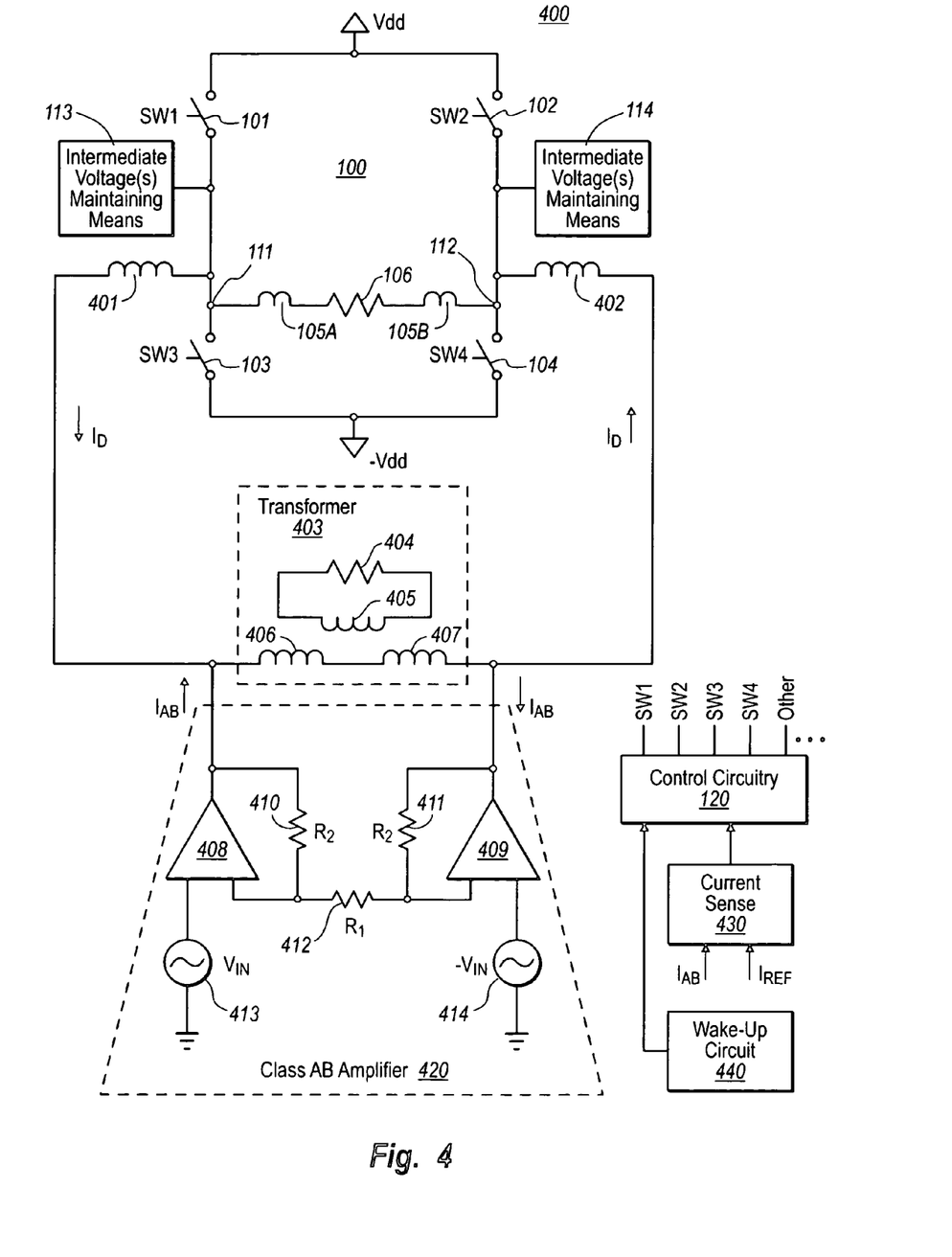
FIG. 4 illustrates a signal driver circuit that may include an H-bridge such as the H-bridge circuit of FIG. 1, along with a class AB amplifier that is coupled in parallel with a load, and that includes a current sense circuit, a control circuit, and a wake-up circuit.

FIG. 4 illustrates a signal driver circuit 400 that is configured to drive a signal over a load. The direct load is the transformer 403, whereas the indirect load is the resistor 404, which could represent a transmission medium, an audio rendering medium, or any other load. Loads other than a transformer are also possible. For instance, the signal driver circuit 400 may drive a resistive load (such as resistor 404) directly if the voltage and current requirements permit.

The signal driver circuit 400 includes the H-bridge 100 described above. In particular, switches 101, 102, 103, 104, inductors 105A and 105B, resistor 106, and means 113 and 114 configured as shown in FIG. 4 are similar to the same components illustrated and described above with respect to FIG. 1. However, in the case of FIG. 4, the first output node 111 is coupled via a load connecting inductor 401 to the transformer 403. The second output node 112 is coupled via a load connecting inductor 402 to the other terminal of the transformer 403. The transformer 403 includes inductors 406, 407 and 405, which are sized to properly transform a voltage and current applied to the resistor 404.

A class AB amplifier 420 has a first output terminal (the output terminal of operational amplifier 408) configured to provide or draw a current (called herein "$I_{AB}$") to or from the first terminal of the transformer 403. A second output terminal of the class AB amplifier 320 (the output terminal of operational amplifier 409) is configured to draw or provide a current (called herein "$-I_{AB}$") from or to the second terminal of the transformer. The class AB amplifier 420 may be any class AB amplifier. In the illustrated example, however, the class AB amplifier includes operation amplifiers 408 and 409, signal sources 413 and 414, and resistors 410, 411 and 412, configured as shown.

Figure 5:
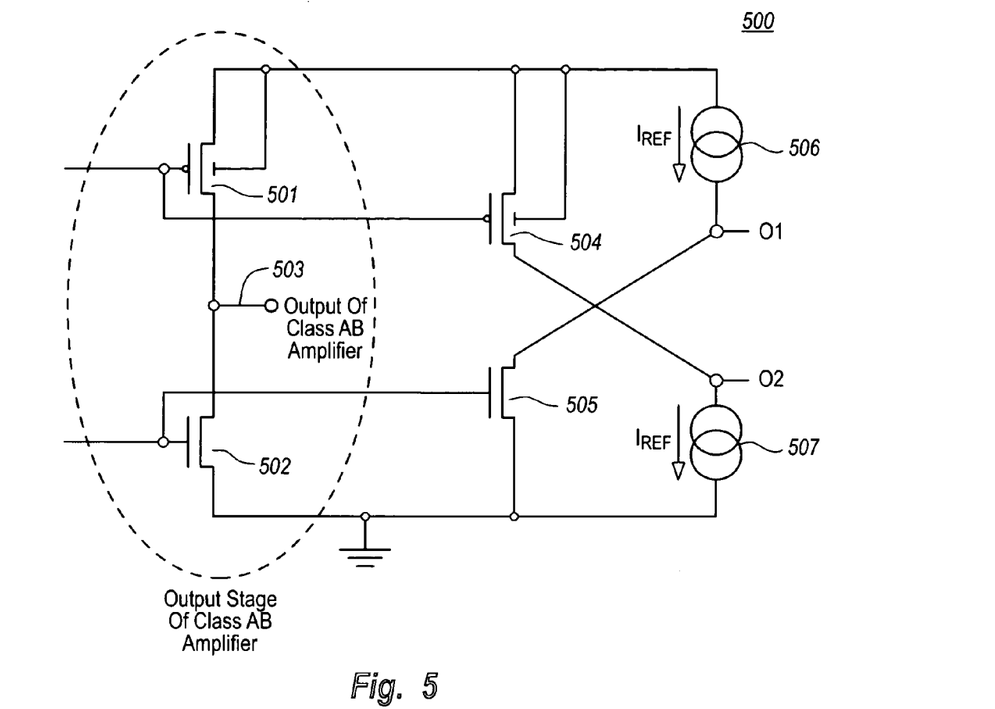
FIG. 5 illustrates an embodiment of the current sense circuit of FIG. 4 in further detail.

The signal driver circuit 400 also includes a current sense circuit 430 that detects when the current provided by the class AB amplifier 420 approximately equals or exceeds a positive reference current (called herein "$I_{REF}$") or approximately equals or falls below a negative reference current (e.g., minus $I_{REF}$). An example of a current sense circuit 430 is illustrated as the current sense circuit 500 of FIG. 5, which includes input terminal 503, transistors 501, 502, 504 and 505, current sources 506 and 507, and output terminals O1 and O2 configured as shown in FIG. 5. The current sense circuit 430 notifies the control circuitry 120 to trigger the H-bridge to change states if the detected current approximately equals or exceeds the reference current. The input terminal 503 of the current sense circuit 500 may be coupled to any of the output terminals of the class AB amplifier 420.

The signal driver circuit 400 also may optionally include a wake-up circuit 440, configured to further trigger the H-bridge 100 to change states if a certain amount of time has elapsed since the last time the H-bridge was triggered to change states, even if the current sense circuit 430 does not detect that the current provided by the class AB amplifier 420 approximately equals or exceeds the reference current.

The control circuitry 120 is configured to control the H-bridge by opening and closing switches as appropriate such that the H-bridge does not transition directly between binary states, without first transitioning to at least one of the one or more intermediate states.

The operation of the signal driver circuit 400 will now be described with respect to the signal timing diagrams of FIGS. 6 through 8, and the state diagram of FIG. 9.

Figure 6:
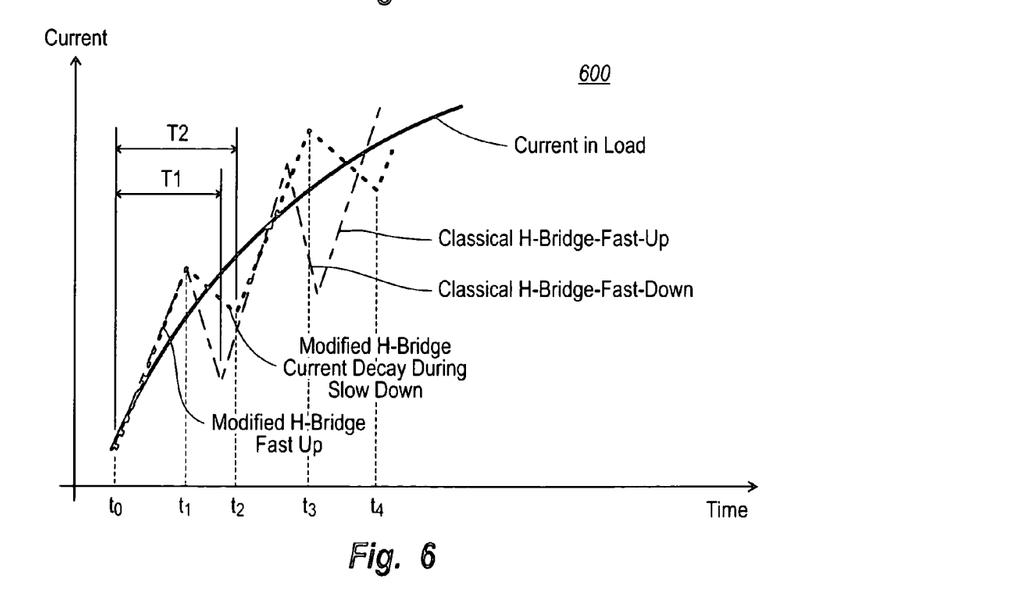
FIG. 6 illustrates a graph of current versus time of the current provided to the load, along with contributions from the H-bridge, with a comparison to current contributions from a conventional H-bridge that does not provide an intermediate state.
Figure 7:
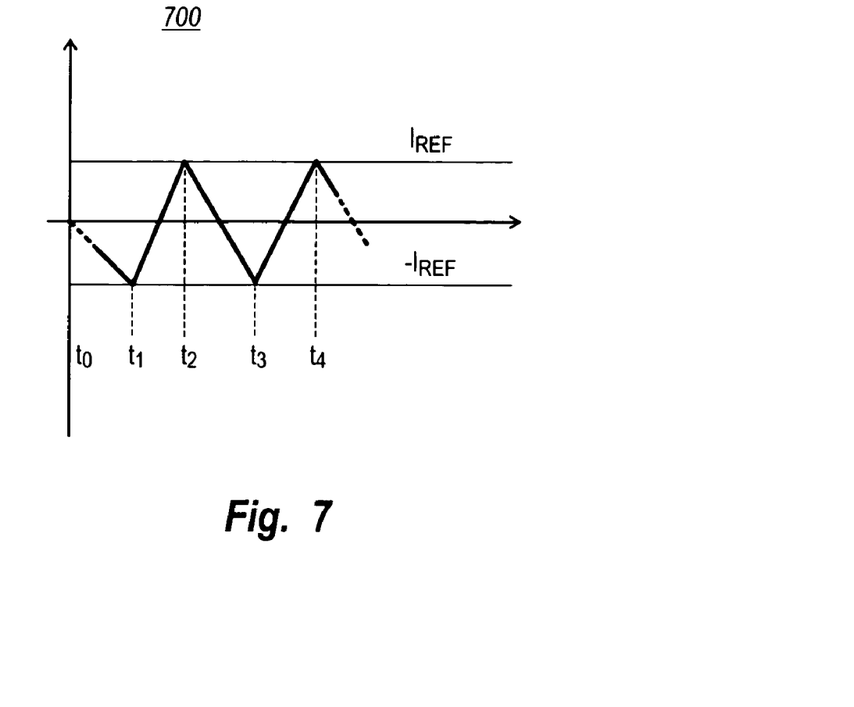
FIG. 7 illustrates a graph of current versus time of the current provided by the class AB amplifier.

FIG. 6 illustrates a signal timing diagram 600 showing a number of different signals. The solid line shows the current signal that the signal driver circuit 400 is driving in the load. Note how smooth the current in the load appears. The short-dashed line represents the current contribution $I_D$ from the modified H-bridge using only one intermediate state. The long-dashed line represents the current contribution from a conventional H-bridge, such as the H-bridge 1000 of FIG. 10. The actual current in the load is the sum of the current contribution $I_D$ from the H-bridge acting as the class D amplifier, and the current contribution $I_{AB}$ from the class AB amplifier 420.

Note that the current contribution from the H-bridge $I_D$ is a piece-wise approximately linear approximation of the actual signal being provided on the load. The highly efficient H-bridge thus provides the vast majority of the current to the load. The class AB amplifier provides a corrective current $I_{AB}$, which provides or draws an appropriate correcting current sufficient to allow the sum of the H-bridge current and class AB current to track the signal desired to be driven on the load.

It is known that class AB amplifiers are generally inefficient. One source of inefficiency stems from the fact that the class AB amplifier requires a consistent current supplied from a DC voltage source. However, the principles of the present invention permit that constant current supply to be relative small, since the class AB amplifier is not required to provide more than a small amount of current for reasons that will be described hereinafter. Accordingly, even though the class AB amplifier is inherently inefficient, its current contribution is small whereas the current contribution from the highly-efficient H-bridge is large, and thus the inefficiencies of the class AB amplifier only slightly degrade the overall efficiency of the signal driver circuit, while provided precision control of the load current.

Referring back to FIGS. 6 and 7, at time t0, the H-bridge is operating in "fast up" mode, which means that the H-bridge is operating in a high binary state, with switches 101 and 104 closed, and switches 102 and 103 open. As will be apparent from the state diagram 900 of FIG. 9, the H-bridge of FIG. 4 operates in three modes; namely "fast-up" mode (i.e., equivalent to the high binary state previously described), and intermediate mode (i.e., equivalent to the intermediate voltage state previously described), and "fast-down" mode (i.e., equivalent to the low binary state previously described)

Due to the presence of the inductors 401 and 402, the current contribution of the H-bridge rises with an approximately constant slope when the H-bridge operates in fast-up mode. The magnitude of this slope will depend on the size of the inductors 401 and 402, where higher inductances will make the slope shallow, and lower inductances will make the slope steep. The size of the inductors 401 and 402 should be chosen so that the slope of the current contribution of the H-bridge in fast up mode is greater than the steepest possible positive slope of a signal current to be driven on the load. On the other hand, the size of the inductors 401 and 402 should also be chosen so that the slope of the current contribution of the H-bridge in fast down mode, is less than (i.e., steeper than) the steepest possible negative slope of the current signal to be driven on the load.

Accordingly, since the H-bridge begins in fast-up mode in the example of FIG. 6, the current contribution to the load steadily increases more and more above the total load current. Referring to FIG. 7, in order to correct for this, the class AB amplifier steadily draws more and more current from the load, so that the sum of the two currents equals the total current that should be applied to the load at any given point in time. This process continues, until time t1, when the current sense circuit 430 detects that the current drawn by the class AB amplifier approximately equals or exceeds a reference current $I_{REF}$. At time t1, the current sense circuit 430 triggers the control circuitry 120 to transition the H-bridge to another state that reduces the current contribution of the class AB amplifier.

Figure 9:
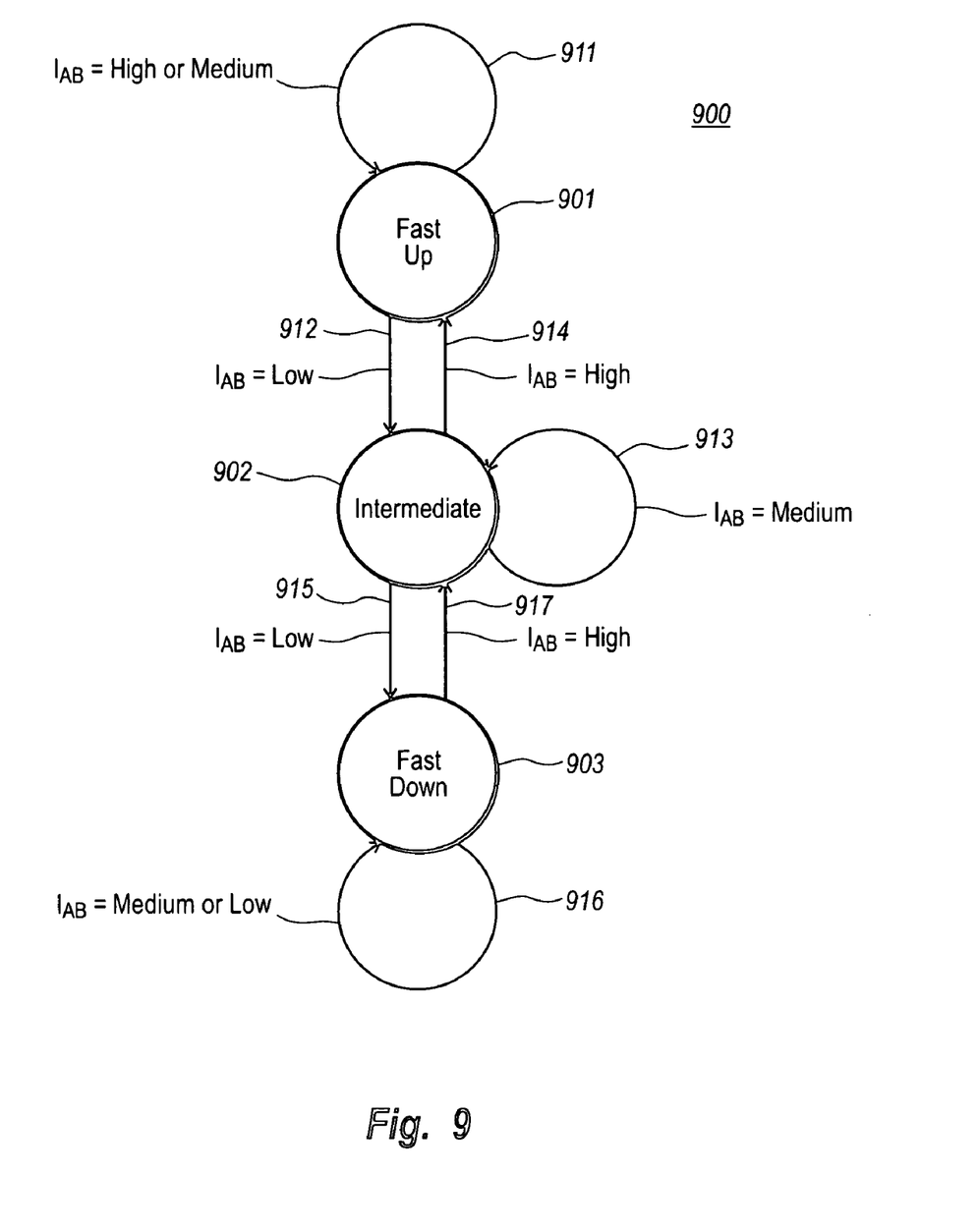
FIG. 9 illustrates a state diagram describing an example operation of the H-bridge in the case where there is one intermediate switching state.

For instance, referring to FIG. 9, the H-bridge begins in the fast-up state 901. Suppose now that the current contribution for the class AB amplifier is desired to be limited to perhaps 5 mA. As long as the measured current $I_{AB}$ provided by the class AB amplifier 420 is greater than 5 mA (signified by $I_{AB}$=High in FIG. 9), or between minus 5 mA and plus 5 mA (signified as $I_{AB}$=Medium in FIG. 9), the H-bridge remains in the fast-up mode as represented by arrow 911.

However, at time t1, the measured current $I_{AB}$ drops below minus 5 mA (represented by $I_{AB}$=Low in FIG. 9), causing the control circuitry 120 to transition the H-bridge to the intermediate state 902 as represented by the arrow 912 of FIG. 9. Of course, to guard against adverse effects of hysteresis, there may be some guard band between each of the Low, Medium, and High states for the measure current $I_{AB}$. For instance, values lower that minus 6 mA may be assigned to the Low category, with values between minus 4 mA and positive 4 mA being assigned to the Medium category, and with values over positive 6 mA being assigned to the High category.

Referring to FIG. 6, after control circuitry 120 transitions the H-bridge to the intermediate state at time t1, the current contribution from the H-bridge begins to decay at a rate that has a modest slope until time t2. In between time t1 and time t2, the current $I_{AB}$ initially becomes less negative, crosses over the zero threshold, and then becomes more positive. During this time, the measured current $I_{AB}$ stays in the Medium range, and thus the H-bridge remains in the intermediate state 902 as represented by arrow 913.

At time t2, the measured current rises to the threshold current level (e.g., 5 mA), which causes the current $I_{AB}$ to be High. Accordingly, the control circuitry 120 causes the H-bridge to transition back to the fast up mode 901 as represented by the arrow 914.

Between time t2 and t3, the measure current $I_{AB}$, will continue to fall until it once again falls below the negative current threshold (e.g., minus 5 mA) at time t3, causing the control circuitry to transition back to the intermediate state 902.

Referring to FIG. 6, this process repeats causing the H-bridge to transition repeatedly between fast up and intermediate modes. During this whole process, however, the current contribution from the class AB amplifier is kept within small current bounds. If the current signal driven on the load has a negative slope (as opposed to the positive slope of FIG. 6, the control circuitry would transition the H-bridge repeatedly (as represented by the arrows 915, 916 and 917) between the fast-down mode 903 and the intermediate mode 902.

Referring back to FIG. 6, it is known to use an H-bridge current in parallel with a class AB amplifier current to drive a load. However, the conventional H-bridge simply transitions directly from one binary state to another. For instance, the H-bridge transitions from fast up to fast down. FIG. 6 shows the relative steep drop of the contribution of the conventional H-bridge during the fast down mode. Several notable advantages of the principles of the present invention may be noted from the observations of FIG. 6.

First, the H-bridge in accordance with the principles of the present invention may perform a relatively stable piecewise linear approximation of the load current using a longer switching period as compared to the standard H-bridge. Compare, for example, time T2 in FIG. 6 as compared to the time period T1 of FIG. 6. Accordingly, the principles of the present invention allow the same signal to be driven on the load while operating at lower operational frequencies. The lower operational frequencies thus further lower the "fCV$^2$" power losses.

Second, the H-bridge, in combination with the class AB amplifier, allows for increased slew rates since the intermediate state permits a closer piecewise linear approximation. For instance, at time t2, the current contribution of the modified H-bridge after exiting the intermediate state is already much higher than the conventional H-bridge after exiting the fast down state. Accordingly, the modified H-bridge can make up this lost territory much more quickly, thereby accomplishing faster slew rates. Further improvements may be accomplished when there is more than one intermediate state being employed by the H-bridge as is the case with FIG. 2B.

Figure 8:
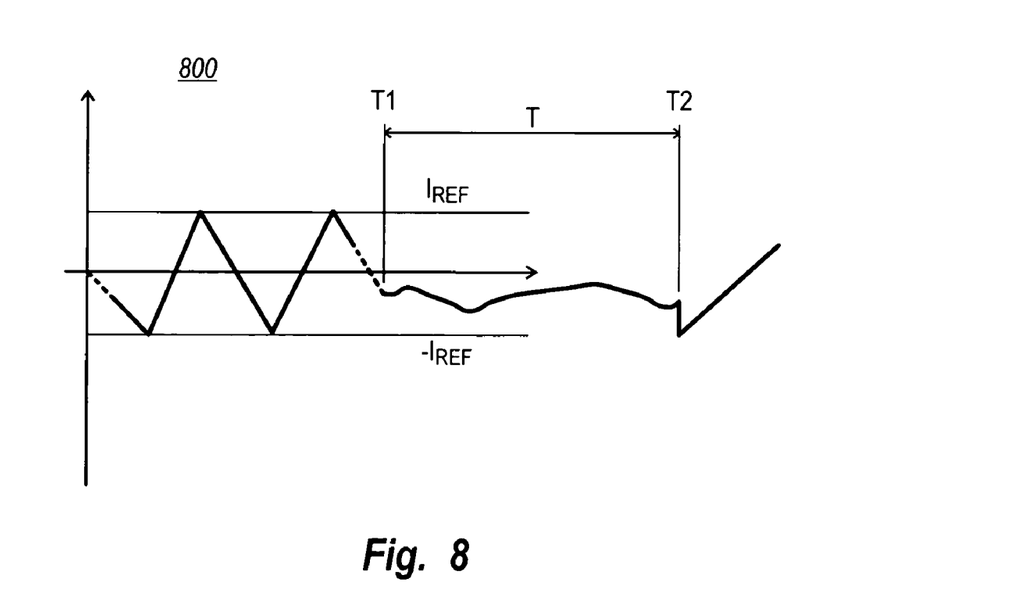
FIG. 8 illustrates a graph of a current versus time of the current provided by the class AB amplifier in a case where the wake-up circuitry of FIG. 4 may be used to trigger a state transition in the H-bridge.

FIG. 8 illustrates an example signal timing diagram 800 of the current contribution of the class AB amplifier. There may be some cases when the H-bridge is triggered to change states less frequently, depending on the nature of the signal being driven on the load. For instance, perhaps the current provided by the class AB amplifier does not reach the threshold current for some time. Such instances of stagnant time may cause the triggering frequency of the Class AB to decrease to approach the frequency of the highest frequency of interest in the current signal being provided to the load. This could cause interference with the load signal.

The wake-up circuit 440 forces a triggering of the H-bridge to occur if has been some time since the wake-up circuit 440 was last triggered. The period of time required for a wake-up is selected such that the triggering frequency of the H-bridge does not interfere with the highest frequency of interest in the current signal on the load. For instance, at time T2 in FIG. 8, the wake-up circuit 440 causes the H-bridge to change states thereby forcing a change in the class AB amplifier current contribution.

Although the wake-up circuit 440 may be used in the context of FIG. 4 in which the modified H-bridge is used, the wake-up circuit 440 may also be used with any combination of an H-bridge and class AB amplifier placed in parallel with a load to ensure that there is no signal interference induced by the triggering frequency of the H-bridge.

Accordingly, the principles of the present invention also provide a unique combination of a modified H-bridge and a class AB amplifier that serves to increase efficiency by reducing power losses. Further, a signal may be driven using lower operational frequencies of the H-bridge and class AB amplifier. Also, faster slew rates may be achieved allowing for higher frequency signals to be driven on the load. Furthermore, the wake-up circuit ensures better signal integrity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit comprising an H-bridge, wherein the H-bridge comprises:
    a first pull-up switch configured to pull a first output node to a high voltage supply when the H-bridge is supplied with power and when the first pull-up switch is closed;
    a second pull-up switch configured to pull a second output node to the high voltage supply when the H-bridge is supplied with power and when the second pull-up switch is closed;
    a first pull-down switch configured to pull the first output node to a low voltage supply when the H-bridge is supplied with power and when the first pull-down switch is closed;
    a second pull-down switch configured to pull the second output node to the low voltage supply when the H-bridge is supplied with power and when the second pull-down switch is closed;
    an inductive impedance coupled between the first output node and the second output node; and
    means for maintaining at least one of the first and second output nodes at a temporally stable intermediate voltage while performing a switching operation.

2. A circuit in accordance with claim 1, wherein the means for maintaining at a temporally stable intermediate voltage while performing a switching operating comprises the following:
    an equalizing switch coupled in parallel with the effective inductance between the first output node and the second output node.

3. A circuit in accordance with claim 1, wherein the means for maintaining at a temporally stable intermediate voltage while performing a switching operation comprises:
    a first intermediate voltage switch configured to selectively couple the first output node to a first intermediate voltage source.

4. A circuit in accordance with claim 3, wherein the means for maintaining at a temporally stable intermediate voltage while performing a switching operation further comprises:
    a second intermediate voltage switch configured to selectively couple the second output node to the first intermediate voltage source.

5. A circuit in accordance with claim 4, wherein the means for maintaining at a temporally stable intermediate voltage while performing a switching operation comprises:
    a third intermediate voltage switch configured to selectively couple the first output node to a second intermediate voltage source; and
    a fourth intermediate voltage switch configured to selectively couple the second output node to the second intermediate voltage source.

6. A circuit in accordance with claim 5, wherein the means for maintaining at a temporally stable intermediate voltage while performing a switching operation comprises:
    a fifth intermediate voltage switch configured to selectively couple the first output node to a third intermediate voltage source; and
    a sixth intermediate voltage switch configured to selectively couple the second output node to the third intermediate voltage source.

7. A circuit in accordance with claim 1, further comprising:
    control circuitry for controlling the H-bridge to operate in at least three phases when performing a switching operation in a first switching direction, wherein the control circuitry is configured such that:
    in an initial phase in the first switching direction, the first pull-up switch and the second pull-down switch are closed, causing current to flow in a first direction from the first output node, through the inductor, to the second output node;
    in at least one intermediate phase in the first switching direction, the first pull-up switch, the second pull-up switch, the first pull-down switch, and the second pull-down switch are open, and the means for maintaining is caused to maintain the first output node at an intermediate voltage corresponding to the intermediate phase for a period of time; and in a final phase in the first switching direction, the first pull-down switch and the second pull-up switch are closed, causing current to flow in a second direction from the second output node, through the inductor, to the first output node.

8. A circuit in accordance with claim 7, wherein the control circuitry controls the H-bridge to operate in at least three phases when performing a switching operation in a second direction opposite the first direction, wherein the control circuitry is configured such that:

in an initial phase in the second switching direction, the first pull-down switch and the second pull-up switch are closed, causing current to flow in the second direction from the second output node, through the inductor, to the first output node;

in at least one intermediate phase in the second switching direction, the first pull-up switch, the second pull-up switch, the first pull-down switch, and the second pull-down switch are open, and the means for maintaining is caused to maintain the second intermediate node at an intermediate voltage corresponding to the intermediate phase for a period of time; and in a final phase in the second switching direction, the first pull-up switch and the second pull-down switch are closed, causing current to flow in the first direction from the first output node, through the inductor, to the second output node.

9. A circuit in accordance with claim 1, wherein the means for maintaining at least one of the first and second output nodes at a temporally stable intermediate voltage while performing a switching operation comprises:

a fifth switch configured to selectively connect and isolate the first and second pull down switches from the low voltage supply; and the control circuitry, wherein the control circuitry is configured to open the fifth switch, and close the first and second pull down switches for at least a period of time while performing the switching operation.

10. A circuit in accordance with claim 1, wherein the means for maintaining at least one of the first and second output nodes at a temporally stable intermediate voltage while performing a switching operation comprises:

a fifth switch configured to selectively connect and isolate the first and second pull up switches from the high voltage supply; and the control circuitry, wherein the control circuitry is configured to open the fifth switch, and close the first and second pull up switches for at least a period of time while performing the switching operation.

11. A circuit in accordance with claim 1, further comprising:

a first load connecting inductor configured to be coupled between the first output node of the H-bridge and a first terminal of a load when the load is connected;

a second load connecting inductor configured to be coupled between the second output node of the H-bridge and a second terminal of the load when the load is connected; and a class AB amplifier having a first output terminal coupled to the first terminal of the load when the load is connected, and having a second output terminal coupled to the second terminal of the load when the load is connected.

12. A circuit in accordance with claim 11, further comprising:

a current sense circuit configured to detect when the current provided by the class AB amplifier approximately equals or exceeds a reference current; and control circuitry functionally coupled to the current sense circuit and the H-bridge so as to trigger the H-bridge to change states when the current sensed by the current sense circuit approximately equals or exceeds the reference current, wherein the trigger occurs in such a manner that the current provided by the class AB amplifier is at least initially reduced after the triggering operation, wherein the H-bridge has a least three states including:

1) a first binary state in which the first pull up switch is closed, the second pull up switch is open, the first pull down switch is open, the second pull down switch is closed, and the means for maintaining is not currently maintaining the first and second intermediate nodes at a temporally stable intermediate voltage;

2) a second binary state in which the first pull up switch is open, the second pull up switch is closed, the first pull down switch is closed, the second pull down switch is open, and the means for maintaining is not currently maintaining the first and second intermediate nodes at a temporally stable intermediate voltage; and 3) one or more intermediate states in which the means for maintaining is maintaining the first and second intermediate nodes at a corresponding temporally stable intermediate voltage;

wherein the control circuitry is configured such that the H-bridge does not transition from the first binary state to the second binary state without first transitioning to at least one of the one or more intermediate states.

13. A circuit in accordance with claim 11, further comprising:

a current sense circuit configured to detect when the current provided by the class AB amplifier approximately equals or exceeds a reference current;

control circuitry functionally coupled to the current sense circuit and the H-bridge so as to trigger the H-bridge to change states when the current sensed by the current sense circuit approximately equals or exceeds the reference current, wherein the trigger occurs in such a manner that the current provided by the class AB amplifier is at least initially reduced after the triggering operation; and a wake-up circuit configured to further trigger the H-bridge to change states if a certain amount of time has elapsed since the last time the H-bridge was triggered, even if the current sense circuit does not detect that the current provided by the class AB amplifier approximately equals or exceeds the reference current.

14. A circuit in accordance with claim 13, wherein the certain amount of time is sufficient to ensure that the triggering frequency is at least twice the highest signal frequency of interest being driven on the load.

15. A circuit comprising:

an H-bridge configured to temporality transition to one or more intermediate state when transition between a first binary state and a second binary state, wherein each of the one or more intermediate states involves keeping the first and second output terminals of the H-bridge at a temporally stable intermediate voltage during a period of time during the switching operation;

a first load connecting inductor configured to be coupled between the first output terminal of the H-bridge and a first terminal of a load when the load is connected;

a second load connecting inductor configured to be coupled between the second output terminal of the H-bridge and a second terminal of the load when the load is connected; and a class AB amplifier having a first output terminal coupled to the first terminal of the load when the load is connected, and having a second output terminal coupled to the second terminal of the load when the load is connected.

16. A circuit in accordance with claim 15, further comprising:

a current sense circuit configured to detect when the current provided by the class AB amplifier approximately equals or exceeds a reference current; and control circuitry functionally coupled to the current sense circuit and the H-bridge so as to trigger the H-bridge to change states when the current sensed by the current sense circuit approximately equals or exceeds the reference current, wherein the trigger occurs in such a manner that the current provided by the class AB amplifier is at least initially reduced after the triggering operation, wherein the control circuitry is configured such that the H-bridge does not transition from the first binary state to the second binary state without first transitioning to at least one of the one or more intermediate states.

17. A circuit in accordance with claim 16, further comprising:

a wake-up circuit configured to further trigger the H-bridge to change states if a certain amount of time has elapsed since the last time the H-bridge was triggered, even if the current sense circuit does not detect that the current provided by the class AB amplifier approximately equals or exceeds the reference current.

18. A circuit in accordance with claim 17, wherein the certain amount of time is sufficient to ensure that the triggering frequency is at least twice the highest signal frequency of interest being driven on the load.

19. A circuit comprising:

an H-bridge configured to transition between first and second binary states;

a first load connecting inductor configured to be coupled between a first output terminal of the H-bridge and a first terminal of a load when the load is connected;

a second load connecting inductor configured to be coupled between a second output terminal of the H-bridge and a second terminal of the load when the load is connected;

a class AB amplifier having a first output terminal coupled to the first terminal of the load when the load is connected, and having a second output terminal coupled to the second terminal of the load when the load is connected;

a current sense circuit configured to detect when the current provided by the class AB amplifier approximately equals or exceeds a reference current;

control circuitry functionally coupled to the current sense circuit and the H-bridge so as to trigger the H-bridge to change states when the current sensed by the current sense circuit approximately equals or exceeds the reference current, wherein the trigger occurs in such a manner that the current provided by the class AB amplifier is at least initially reduced after the triggering operation; and a wake-up circuit configured to further trigger the H-bridge to change states if a certain amount of time has elapsed since the last time the H-bridge was triggered, even if the current sense circuit does not detect that the current provided by the class AB amplifier approximately equals or exceeds the reference current.

20. A circuit in accordance with claim 19, wherein the certain amount of time is sufficient to ensure that the triggering frequency is at least twice the highest signal frequency of interest being driven on the load.

* * * * *